(12) United States Patent
Lin et al.

(10) Patent No.: US 12,310,413 B2
(45) Date of Patent: May 27, 2025

(54) ELECTRONIC CIGARETTE CAPABLE OF DOSE CONTROL AND CONTROL METHOD THEREOF

(71) Applicant: HUIZHOU HAPPY VAPING TECHNOLOGY LIMITED, Guangdong (CN)

(72) Inventors: Guangrong Lin, Guangdong (CN); Xianbin Zheng, Guangdong (CN); Xiyong Zhang, Guangdong (CN)

(73) Assignee: HUIZHOU HAPPY VAPING TECHNOLOGY LIMITED, Huizhou (CN)

( * ) Notice: Subject to any disclaimer, the term of this patent is extended or adjusted under 35 U.S.C. 154(b) by 450 days.

(21) Appl. No.: 17/722,385

(22) Filed: Apr. 17, 2022

(65) Prior Publication Data

US 2022/0232898 A1 Jul. 28, 2022

Related U.S. Application Data

(63) Continuation-in-part of application No. PCT/CN2020/108593, filed on Aug. 12, 2020.

(30) Foreign Application Priority Data

Oct. 18, 2019 (CN) .......................... 201910995144.8

(51) Int. Cl.
*A24F 40/51* (2020.01)
*A24F 40/10* (2020.01)
(Continued)

(52) U.S. Cl.
CPC .............. *A24F 40/51* (2020.01); *A24F 40/10* (2020.01); *A24F 40/57* (2020.01); *A24F 40/60* (2020.01);
(Continued)

(58) Field of Classification Search
CPC .......... A24F 40/51; A24F 40/10; A24F 40/57; A24F 40/60; G01R 26/16; G06F 1/26; H05B 1/0244
See application file for complete search history.

(56) References Cited

FOREIGN PATENT DOCUMENTS

| CN | 107997239 A | 5/2018 | |
|---|---|---|---|
| CN | 108135268 A | * 6/2018 | ........... A24B 15/167 |

(Continued)

OTHER PUBLICATIONS

English Machine Translation of CN109924548A to Lin; Jun. 25, 2019; 9 pages. (Year: 2019).*

(Continued)

*Primary Examiner* — Linda L Gray

(57) ABSTRACT

The disclosure provides an electronic cigarette capable of dose control and a control method thereof. The electronic cigarette includes a housing, a liquid storage chamber, a vaporizing device, a battery, an airflow sensor, and a control circuit. The control circuit includes a microcontroller, a power control unit, a timing unit, an energy statistics and conversion unit, and an indication unit. The microcontroller is preset with preset parameters including a preset dose threshold. The airflow sensor detects airflow during vaping, then the power control unit supplies power for a heating unit, and the timing unit starts timing, the power control unit detects power of the heating unit, the energy statistics and conversion unit calculates and converts consumption of electric energy into a dose of consumed cigarette liquid, when the dose of consumed cigarette liquid reaches the preset dose threshold, the indication unit provides an indication.

12 Claims, 4 Drawing Sheets

(51) Int. Cl.
    *A24F 40/57*     (2020.01)
    *A24F 40/60*     (2020.01)
    *G01R 27/16*     (2006.01)
    *G06F 1/26*     (2006.01)
    *H05B 1/02*     (2006.01)

(52) U.S. Cl.
    CPC ............... *G01R 27/16* (2013.01); *G06F 1/26* (2013.01); *H05B 1/0244* (2013.01)

(56) References Cited

FOREIGN PATENT DOCUMENTS

| CN | 109430947 A | 3/2019 |
| CN | 109924548 A | 6/2019 |

OTHER PUBLICATIONS

English Machine Translation of CN108135268 to Baker; Jun. 8, 2018; 15 pages. (Year: 2018).*
International Search Report of PCT Patent Application No. PCT/CN2020/108593 issued on Nov. 25, 2020.

\* cited by examiner

ELECTRONIC CIGARETTE CAPABLE OF DOSE CONTROL AND CONTROL METHOD THEREOF

CROSS REFERENCE TO RELATED APPLICATIONS

The present application is a Continuation-In-Part Application of PCT Application No. PCT/CN2020/108593 filed on Aug. 12, 2020, which claims the benefit of Chinese Patent Application No. 201910995144.8 filed on Oct. 18, 2019. All the above are hereby incorporated by reference in their entirety.

TECHNICAL FIELD

The disclosure relates to the technical field of electronic cigarettes, and more specially, to an electronic cigarette capable of dose control and a control method thereof.

BACKGROUND

The electronic cigarette or vaporizing device usually heats and vaporizes liquid substances or paste-like substances, such as drugs and cigarette liquid, to produce aerosol or vapor for users to vape. Different from tobacco cigarettes which may be directly combusted to produce smoke, the electronic cigarette produces vapor without cigarette tar and many harmful particles. Thus, the electronic cigarettes are widely used.

Existing electronic cigarettes or vaporizing devices usually can be freely used by the users without any appropriate restriction during use until the substances to be vaporized, such as drugs and cigarette liquid, run out. The amount of aerosol or vapor produced by vaporizing cigarette liquid cannot be calculated, indicated, controlled, or restricted. In such a case, the users may overuse in a short period and too much dose of cigarette liquid probably will be harmful to health. Especially when taking vaporized liquid medicine, the dose of the liquid medicine must be taken quantitatively according to the doctor's advice, if the dose of the liquid medicine is not limited, unintended side effects may be caused.

SUMMARY

Technical Problem

The purpose of the disclosure is to provide an electronic cigarette capable of dose control and a control method in order to overcome shortcomings of the above technology.

Technical Solutions

The disclosure provides a technical solution as follows. An electronic cigarette capable of dose control, including a housing, a liquid storage chamber, a vaporizing device, a battery, an airflow sensor, and a control circuit, wherein the liquid storage chamber is configured to store cigarette liquid, the battery is configured to supply power for the vaporizing device and the control circuit, the airflow sensor is configured to detect airflow, and the vaporizing device is configured to transfer the cigarette liquid, and heat and vaporize the cigarette liquid into vapor. The vaporizing device includes a heating unit, the control circuit includes a microcontroller, a power control unit, a timing unit, an energy statistics and conversion unit, and an indication unit that are electrically connected to each other. The microcontroller is preset with preset parameters, and the preset parameters include a preset dose threshold. The power control unit is configured to detect and control power of the heating unit. The timing unit is connected with the airflow sensor and configured to time total time the airflow sensor worked. Once the airflow sensor detects the airflow, the power control unit, by means of turning on a power switch therein, supplies power for the heating unit. The energy statistics and conversion unit is configured to calculate consumption of electric energy based on the power detected by means of the power control unit and the total time the airflow sensor worked timed by means of the timing unit, and then convert the consumption of electric energy into a dose of consumed cigarette liquid. The indication unit includes a buzzer, an LED indicator, or a vibrator. The control circuit is configured as: when the electronic cigarette is being vaped, the airflow sensor detects the airflow, then the power control unit turns on the power switch to supply power for the heating unit and the timing unit starts timing simultaneously, the power control unit detects the power of the heating unit, the energy statistics and conversion unit calculates the consumption of electric energy and converts it into the dose of consumed cigarette liquid, when the dose of consumed cigarette liquid reaches the preset dose threshold, the indication unit provides an indication by sound, light, or vibration.

Preferably, when the indication unit provides the indication by sound, light, or vibration, the microcontroller may control the power control unit to turn off the power switch to stop supplying power for the heating unit simultaneously.

Preferably, the preset dose threshold preset in the microcontroller may include a preset single dose threshold, i.e., a preset dose threshold for each puff.

Preferably, the preset dose threshold preset in the microcontroller may include a preset total dose threshold, i.e., a preset dose threshold of total vapor vaped in a unit time.

Preferably, the preset total dose threshold may be a total dose threshold in 10 minutes, or a total dose threshold in 24 hours.

Preferably, the control circuit may further include a resistance detection unit. The resistance detection unit is configured to detect a change of a resistance of the heating unit and send a value of the change of the resistance to the microcontroller, and the microcontroller may control the power control unit based on the value of the change of the resistance, to achieve a constant power output control or a constant voltage output control.

Preferably, the control circuit may further include a display unit, and the display unit is configured to display the preset parameters and other real-time parameters.

Preferably, the airflow sensor may be provided with three pins, wherein pin 1 is grounded, pin 2 is connected to a MIC(microphone) signal end, the MIC signal end is configured to connect to the microcontroller and the timing unit, and pin 3 is connected to a BAT+ signal end, and is connected to a capacitor C10 in series and then grounded simultaneously.

Another technical solution of the disclosure is implemented by a control method of an electronic cigarette capable of dose control, which is applied to the electronic cigarette capable of dose control of previous technical solution, the control method includes steps of:

(1) presetting relevant preset parameters in the microcontroller, powering on the electronic cigarette, and initializing the control circuit automatically;

(2) controlling the electronic cigarette in a standby state;

(3) detecting whether there is airflow by means of the airflow sensor, if yes, go to next step, if no, return to previous step;

(4) controlling the power control unit to supply power for the heating unit by means of the microcontroller;

(5) timing by means of the timing unit according to an activity of the airflow sensor;

(6) detecting power by means of the power control unit;

(7) calculating consumption of electric energy by means of the energy statistics and conversion unit based on the power and total time timed by means of the timing unit, and converting the consumption of electric energy into a dose of consumed cigarette liquid;

(8) determining whether the dose of consumed cigarette liquid reaches a preset dose threshold by means of the microcontroller, if yes, go to next step, if no, return to step (3);

(9) providing an indication by sound, light, or vibration by means of the indication unit, and then returns to step (3).

Another technical solution of the disclosure is implemented by a control method of an electronic cigarette capable of dose control, which is applied to the electronic cigarette capable of dose control of the previous technical solution, the control method includes steps of:

(1) presetting relevant preset parameters in the microcontroller, powering on the electronic cigarette, and initializing the control circuit automatically;

(2) controlling the electronic cigarette in a standby state;

(3) detecting whether there is airflow by means of the airflow sensor, if yes, go to next step, if no, return to previous step;

(4) controlling the power control unit to supply power for the heating unit by means of the microcontroller;

(5) timing by means of the timing unit according to an activity of the airflow sensor;

(6) detecting power by means of the power control unit;

(7) calculating consumption of electric energy by means of the energy statistics and conversion unit based on the power and total time timed by means of the timing unit, and converting the consumption of electric energy into a dose of consumed cigarette liquid;

(8) determining whether the dose of consumed cigarette liquid reaches a preset dose threshold by means of the microcontroller, if yes, go to next step, if no, return to step (3);

(9) providing an indication by sound, light, or vibration by means of the indication unit;

(10) controlling the power control unit to stop supplying power for the heating unit by means of the microcontroller;

(11) powering off the electronic cigarette automatically.

Advantages

The electronic cigarette capable of dose control and the control method thereof according to the disclosure may calculate the consumption of electric energy of the heating unit, thus may calculate amount of aerosol or vapor from vaporized cigarette liquid, and then may calculate the dose of consumed cigarette liquid, thereby may provide the indication for the user or prevent the user from overusing the aerosol or vapor in single puff or in a unit time and avoid health hazards.

DETAILED DESCRIPTION OF ILLUSTRATED EMBODIMENTS

Figure 1:
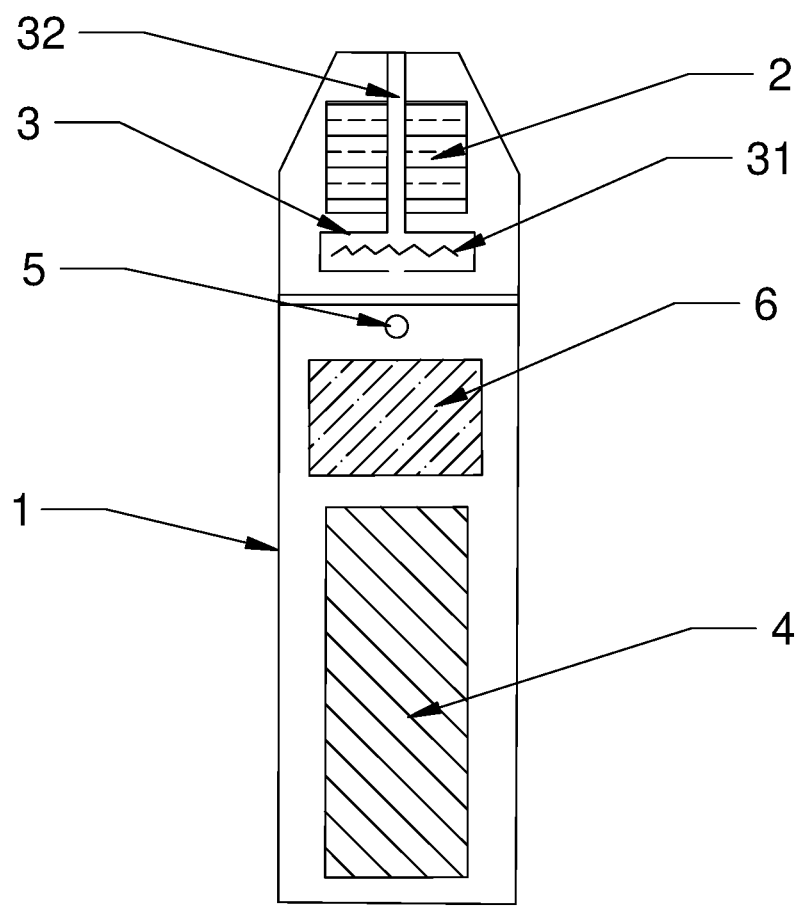
FIG. 1 is a cross-sectional view of an electronic cigarette capable of dose control according to the disclosure.

Referring to FIG. 1, an electronic cigarette capable of dose control according to the disclosure comprises a housing 1, a liquid storage chamber 2, a vaporizing device 3, a battery 4, an airflow sensor 5, and a control circuit 6. Herein, the liquid storage chamber 2 serves to store cigarette liquid. The battery 4 serves to supply power for the vaporizing device 3 and the control circuit 6. The vaporizing device 3 serves to transfer the cigarette liquid stored in the liquid storage chamber and heat and vaporize it into vapor. The vaporizing device 3 includes a heating unit 31 and a vapor passage 32. The airflow sensor 5 serves to detect airflow or an air pressure difference during inhalation. When the airflow or the air pressure difference is detected, a power switch of a power control unit may be turned on under control of a microcontroller MCU, to supply power for the heating unit 31. The airflow sensor 5 may be a microphone, or a digital airflow sensor, or a digital air pressure sensor.

Figure 2:
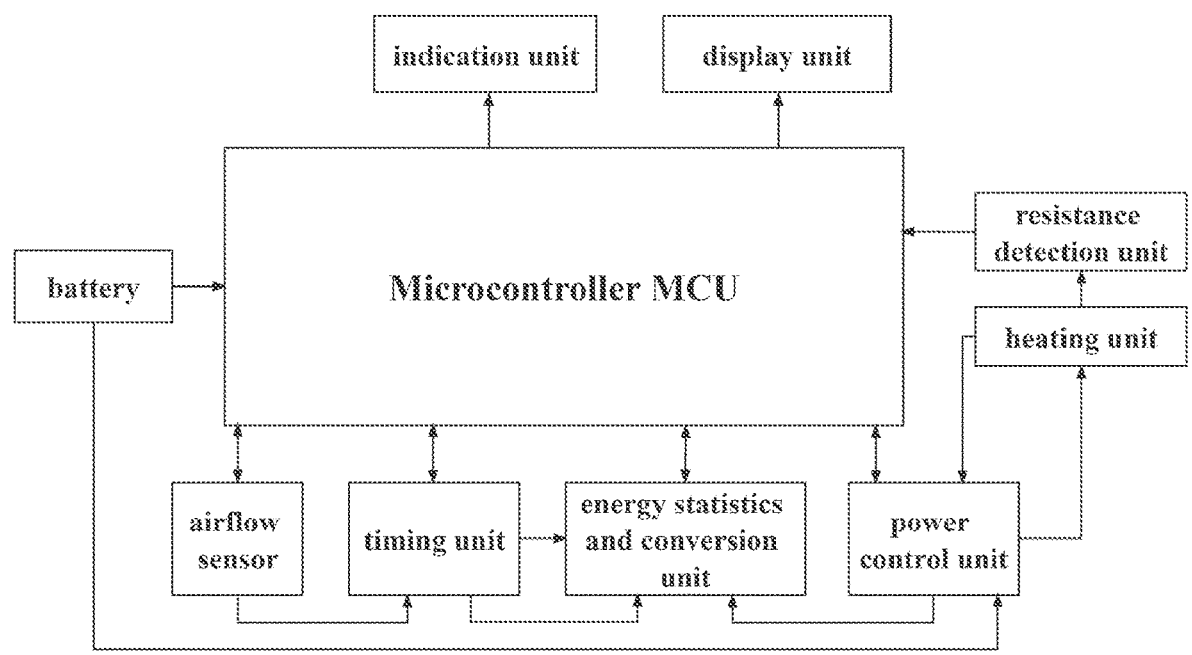
FIG. 2 is a functional and structural view illustrating a control circuit of an electronic cigarette capable of dose control according to the disclosure.

Referring to FIG. 2, the control circuit 6 as shown in FIG. 1 includes a microcontroller MCU, a power control unit, a timing unit, an energy statistics and conversion unit, a display unit, and an indication unit, which are electrically connected with each other. The microcontroller MCU serves as a command and control center of the control circuit. The microcontroller MCU is preset with preset parameters including a preset dose threshold. The power control unit serves to detect and control power of the heating unit. The power control unit includes a power switch for powering on and off the heating unit. The timing unit is connected with the airflow sensor and configured to time total time the airflow sensor worked. In such a case, the airflow sensor keeps working throughout a single puff of a user during vaping. The timing unit may calculate total time the airflow sensor works during the single puff, and may calculate total time the airflow sensor works in a unit time.

According to common knowledge, electric energy consumed by the heating unit is $W=P \times T$, wherein P refers to power, and T refers to time. Theoretically, a certain amount of heat energy will be generated when a certain amount of electric energy is consumed. The heat energy may be used for heating cigarette liquid to produce a certain amount of vapor, and a certain dose of the cigarette liquid will be consumed when the certain amount of vapor is produced. Hence, there is a correspondence relationship between the consumption of electric energy and a dose of consumed cigarette liquid. Different cigarette liquids may contain different substances, have different densities, have different viscosity, or the like, thereby energy required for being vaporized thereof is different, and thus the correspondence relationships are different. By simulating an act of inhalation, conducting experiments with modeling according to a particular electronic cigarette product and a particular type of cigarette liquid to be used, and testing relevant data, the correspondence relationship between the consumption of electric energy and the dose of consumed cigarette liquid may be found out.

The energy statistics and conversion unit may be configured to calculate consumption of electric energy based on the power detected by means of the power control unit and the total time the airflow sensor worked timed by means of the timing unit, and then convert the consumption of electric energy into a dose of consumed cigarette liquid based on the correspondence relationship, between the consumption of electric energy and the dose of consumed cigarette liquid of the vaporizing device, which is obtained by conducting the experiments with modeling. The indication unit may include a buzzer, an LED indicator, or a vibrator.

Referring to FIG. 2, the control circuit is configured in such a manner that, when the electronic cigarette is used for vaping, the airflow sensor turns on the power switch to supply power for the heating unit once it detects airflow or an air pressure difference, and meanwhile, the timing unit starts timing. The power control unit detects the power of the heating unit. The energy statistics and conversion unit calculates the consumption of electric energy and converts it into the amount of vapor or the dose of consumed cigarette liquid. When the amount of vapor or the dose of consumed cigarette liquid reaches the preset dose threshold, the indication unit provides an indication by sound, light, or vibration, to inform the user that the preset dose threshold is reached and it is suggested to stop vaping.

In another embodiment, the microcontroller controls the power control unit to stop supplying power for the heating unit simultaneously when the indication unit provides the indication by sound, light, or vibration, thereby directly stopping a use of the electronic cigarette when the preset dose threshold is reached.

In the present embodiment, the preset dose threshold preset in the microcontroller includes a preset single dose threshold, i.e., a preset dose threshold for each puff. In the case that the user takes a long single puff, too much vapor may be vaped and an appropriate restriction may be desired. With the preset single dose threshold being preset, the energy statistics and conversion unit calculates the consumption of electric energy in real time and converts it into the dose of consumed cigarette liquid in real time, and the microcontroller compares the dose of consumed cigarette liquid in real time with the preset single dose threshold. If the preset single dose threshold is reached or exceeded, the indication unit provides the indication by sound, light, or vibration.

The preset dose threshold preset in the microcontroller further includes a preset total dose threshold, i.e., a preset dose threshold of total vapor vaped in a unit time. In the case that the user successively takes puffs in a certain time, too much vapor may be vaped and an appropriate restriction may be desired. With the preset total dose threshold being preset, the energy statistics and conversion unit calculates total consumption of electric energy in a unit time and converts it into total dose of consumed cigarette liquid in a unit time, and the microcontroller compares the total dose of consumed cigarette liquid in a unit time with the preset total dose threshold. If the preset total dose threshold is reached or exceeded, the indication unit provides the indication by sound, light, or vibration. In the embodiment, the total dose threshold includes a total dose threshold in 10 minutes and a total dose threshold in 24 hours, which are respectively provided for indicating and controlling the total dose of cigarette liquid consumed in 10 minutes and the total dose of cigarette liquid consumed in 24 hours.

According to the calculation formula of the power, the power $P=U^2/R$, wherein U refers to voltage and R refers to resistance. The resistance R of the heating unit of electronic cigarette products may be constant or may change as temperature changes. The control circuit according to the disclosure may further include a resistance detection unit. The resistance detection unit is configured to detect a change of the resistance R of the heating unit and send a value of the change of the resistance to the microcontroller, such that the microcontroller may control the power control unit based on the value of the change of the resistance, to achieve a constant power output control or a constant voltage output control.

Referring to FIG. 2, the control circuit of the embodiment of the disclosure further includes a display unit, and the display unit is configured to display preset parameters and other real-time parameters.

Figure 3:
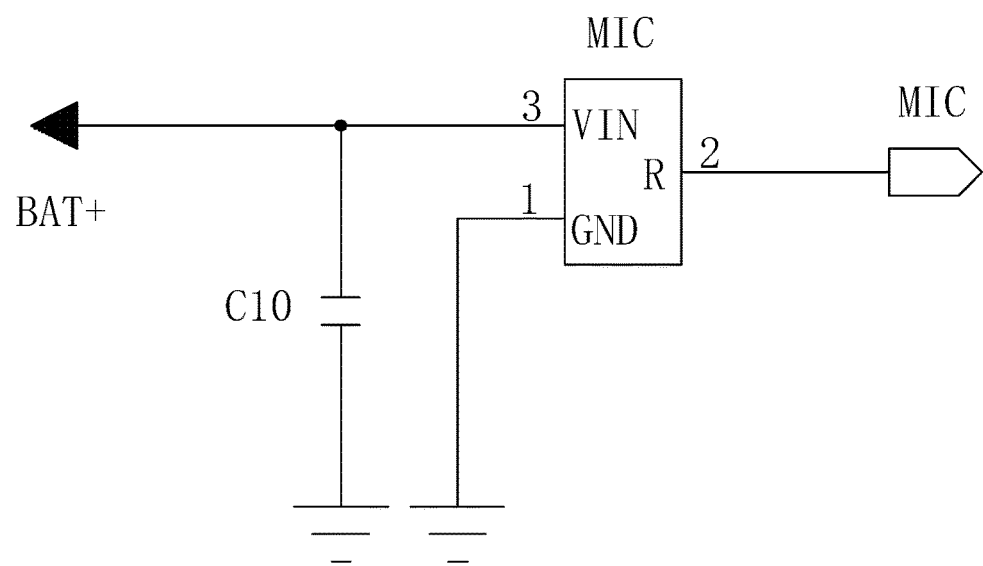
FIG. 3 is a circuit diagram illustrating an airflow sensor of an electronic cigarette capable of dose control according to the disclosure.

Referring to FIG. 3, the airflow sensor of the embodiment of the disclosure is provided with three pins, wherein pin 1 is grounded, pin 2 is connected to a MIC(microphone) signal end, the MIC signal end is configured to connect to the microcontroller and the timing unit, and pin 3 is connected to a BAT+ signal end, and is connected to a capacitor C10 in series and then grounded simultaneously.

Figure 4:
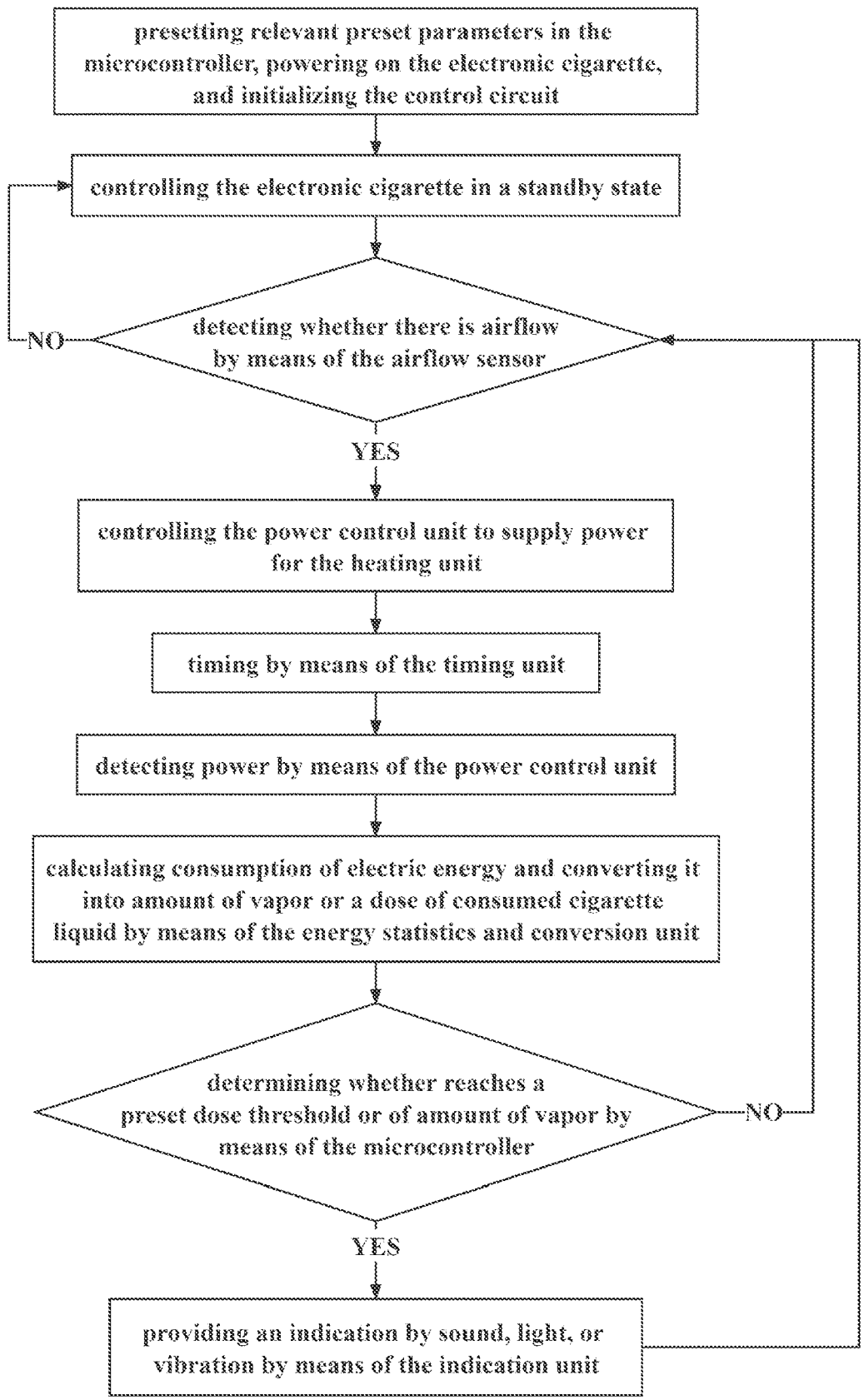
FIG. 4 is a first flow chart of a control method of an electronic cigarette capable of dose control according to the disclosure.

Referring to FIG.4, a control method of an electronic cigarette capable of dose control according to the disclosure, applied to the electronic cigarette capable of dose control referring to FIG. 1, includes steps of:

(1) presetting relevant preset parameters in the microcontroller, powering on the electronic cigarette, and initializing the control circuit automatically;

(2) controlling the electronic cigarette in a standby state;

(3) detecting whether there is airflow by means of the airflow sensor, if yes, go to next step, if no, return to previous step;

(4) controlling the power control unit to supply power for the heating unit by means of the microcontroller;

(5) timing by means of the timing unit according to an activity of the airflow sensor;

(6) detecting power by means of the power control unit;

(7) calculating consumption of electric energy by means of the energy statistics and conversion unit based on the power and total time timed by means of the timing unit, and converting the consumption of electric energy into a dose of consumed cigarette liquid;

(8) determining whether the dose of consumed cigarette liquid reaches a preset dose threshold by means of the microcontroller, if yes, go to next step, if no, return to step (3);

(9) providing an indication by sound, light, or vibration by means of the indication unit, and then returns to step (3).

Figure 5:
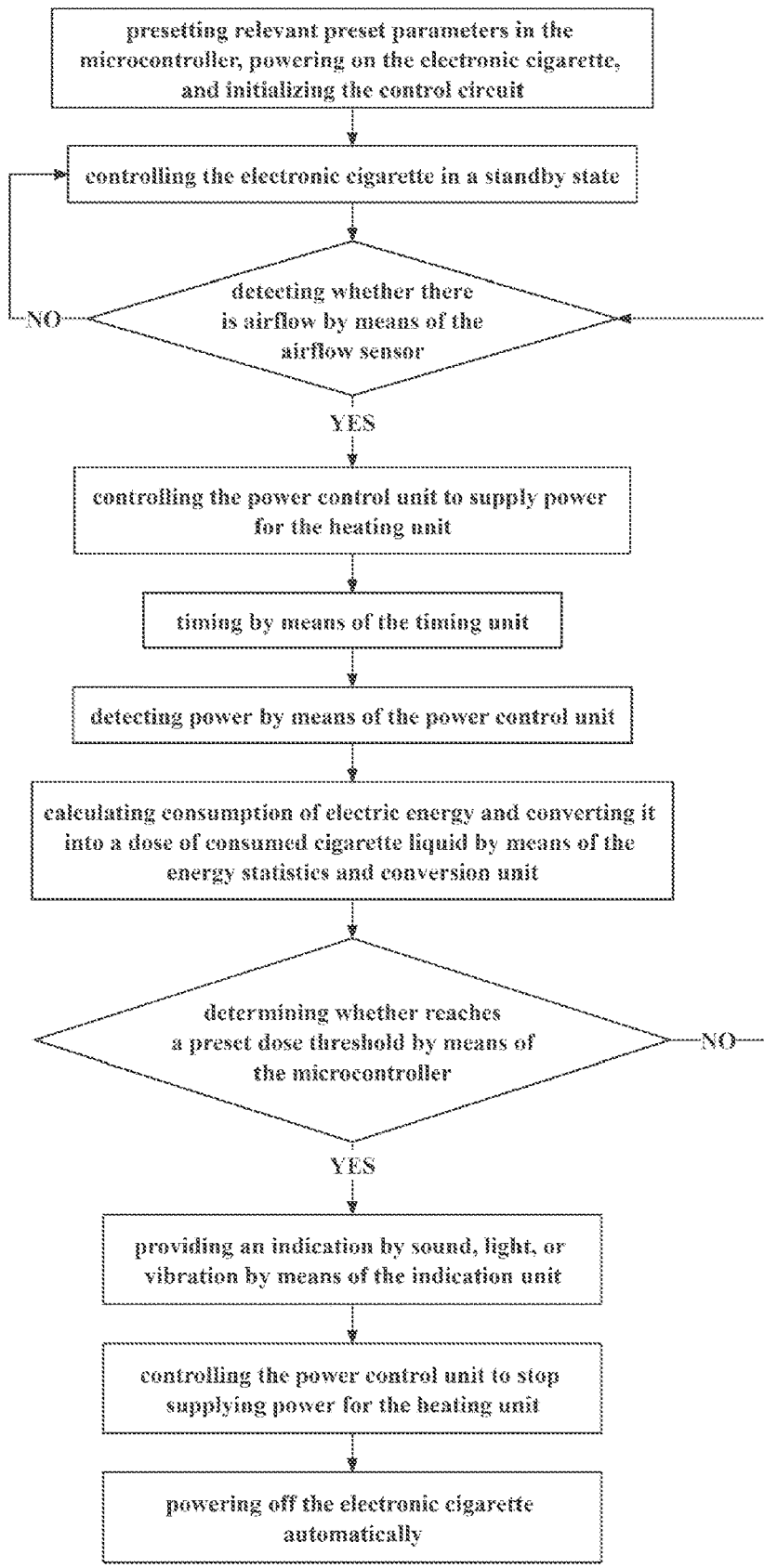
FIG. 5 is a second flow chart of a control method of an electronic cigarette capable of dose control according to the disclosure.

Referring to FIG. 5, a control method of an electronic cigarette capable of dose control according to the disclosure, applied to an electronic cigarette capable of dose control, includes steps of:

(1) presetting relevant preset parameters in a microcontroller, powering on the electronic cigarette, and initializing a control circuit automatically;

(2) controlling the electronic cigarette in a standby state;

(3) detecting whether there is airflow by means of an airflow sensor, if yes, go to next step, if no, return to previous step;

(4) controlling a power control unit to supply power for a heating unit by means of the microcontroller;

(5) timing by means of a timing unit according to an activity of the airflow sensor;

(6) detecting power by means of the power control unit;

(7) calculating consumption of electric energy by means of an energy statistics and conversion unit based on the power and total time timed by means of the timing unit, and converting the consumption of electric energy into a dose of consumed cigarette liquid;

(8) determining whether the dose of consumed cigarette liquid reaches a preset dose threshold by means of the microcontroller, if yes, go to next step, if no, return to step (3);

(9) providing an indication by sound, light, or vibration by means of an indication unit;

(10) controlling the power control unit to stop supplying power for the heating unit by means of the microcontroller;

(11) powering off the electronic cigarette automatically.

INDUSTRIAL APPLICABILITY

All the above are merely preferred embodiments of the disclosure. The equivalent changes and modifications made according to the scope of the claims of the disclosure shall fall within the scope of the claims of the disclosure.

The invention claimed is:

1. An electronic cigarette capable of dose control, comprising a housing, a liquid storage chamber, a vaporizer, a battery, an airflow sensor, and a control circuit, wherein the liquid storage chamber is configured to store cigarette liquid, the battery is configured to supply power for the vaporizer and the control circuit, the airflow sensor is configured to detect airflow, and the vaporizer is configured to transfer the cigarette liquid, and heat and vaporize the cigarette liquid into vapor, the vaporizer comprises a heater, and the control circuit comprises a microcontroller, a power control unit, a timer, an energy calculator, and an indicator that are electrically connected to each other, the microcontroller is preset with preset parameters, and the preset parameters comprise a preset dose threshold, the power controller is configured to detect and control power of the heater, and the timer is connected with the airflow sensor and configured to time a total time the airflow sensor worked, once the airflow sensor detects the airflow, the power control unit, by means of turning on a power switch therein, supplies power for the heater, the energy calculator is configured to calculate a consumption of electric energy based on the power detected by means of the power controller and the total time the airflow sensor worked timed by means of the timer, and then convert the consumption of electric energy into a dose of consumed cigarette liquid, the indicator comprises a buzzer, an LED indicator, or a vibrator, and the control circuit is configured as: responsive to the electronic cigarette being vaped, the airflow sensor detects the airflow, then the power controller turns on the power switch to supply power for the heater, and simultaneously the timer starts timing, the power controller detects the power of the heater, the energy calculator calculates the consumption of electric energy and converts it into the dose of consumed cigarette liquid, responsive to the dose of consumed cigarette liquid reaches the preset dose threshold, the indicator provides an indication by sound, light, or vibration, wherein the airflow sensor is provided with three pins, pin 1 is grounded, pin 2 is connected to a microphone signal end, the microphone signal end is configured to connect to the microcontroller and the timer, and pin 3 is connected to a BAT+ signal end, and the pin 3 is also connected to a capacitor C10 in series and then grounded.

2. The electronic cigarette capable of dose control according to claim 1, wherein the microcontroller controls the power controller to turn off the power switch to stop supplying power for the heater simultaneously when the indicator provides the indication by sound, light, or vibration.

3. The electronic cigarette capable of dose control according to claim 1, wherein the preset dose threshold preset in the microcontroller comprises a preset single dose threshold which indicates a preset dose threshold for each puff.

4. The electronic cigarette capable of dose control according to claim 2, wherein the preset dose threshold preset in the microcontroller comprises a preset single dose threshold which indicates a preset dose threshold for each puff.

5. The electronic cigarette capable of dose control according to claim 1, wherein the preset dose threshold preset in the microcontroller comprises a preset total dose threshold which indicates a preset dose threshold of total vapor vaped in a unit time.

6. The electronic cigarette capable of dose control according to claim 2, wherein the preset dose threshold preset in the microcontroller comprises a preset total dose threshold which indicates a preset dose threshold of total vapor vaped in a unit time.

7. The electronic cigarette capable of dose control according to claim 5, wherein the preset total dose threshold is a total dose threshold in 10 minutes, or a total dose threshold in 24 hours.

8. The electronic cigarette capable of dose control according to claim 6, wherein the preset total dose threshold is a total dose threshold in 10 minutes, or a total dose threshold in 24 hours.

9. The electronic cigarette capable of dose control according to claim 1, wherein the control circuit further comprises a resistance detector, the resistance detector is configured to detect a change of a resistance of the heater and send a value of the change of the resistance to the microcontroller, and the microcontroller controls the power controller based on the value of the change of the resistance, to achieve a constant power output control or a constant voltage output control.

10. The electronic cigarette capable of dose control according to claim 2, wherein the control circuit further comprises a resistance detector, the resistance detector is configured to detect a change of a resistance of the heater and send a value of the change of the resistance to the microcontroller, and the microcontroller controls the power controller based on the value of the change of the resistance, to achieve a constant power output control or a constant voltage output control.

11. The electronic cigarette capable of dose control according to claim 1, wherein the control circuit further comprises a displayer, and the displayer is configured to display the preset parameters and real-time parameters.

12. The electronic cigarette capable of dose control according to claim 2, wherein the control circuit further comprises a displayer, and the displayer is configured to display the preset parameters and real-time parameters.

* * * * *